United States Patent
Herr et al.

(10) Patent No.: US 10,236,869 B2
(45) Date of Patent: Mar. 19, 2019

(54) SUPERCONDUCTING TRANSMISSION DRIVER SYSTEM

(71) Applicants: Quentin P. Herr, Ellicott City, MD (US); Edward Rudman, Glen Burnie, MD (US); Jonathan D. Egan, Hanover, MD (US); Vladimir V. Talanov, Ellicott City, MD (US)

(72) Inventors: Quentin P. Herr, Ellicott City, MD (US); Edward Rudman, Glen Burnie, MD (US); Jonathan D. Egan, Hanover, MD (US); Vladimir V. Talanov, Ellicott City, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 71 days.

(21) Appl. No.: 15/356,049

(22) Filed: Nov. 18, 2016

(65) Prior Publication Data
US 2018/0145664 A1    May 24, 2018

(51) Int. Cl.
*H03K 17/92*    (2006.01)
*H03K 3/38*    (2006.01)
*H01L 39/02*    (2006.01)

(52) U.S. Cl.
CPC .............. *H03K 3/38* (2013.01); *H01L 39/025* (2013.01); *H03K 17/92* (2013.01)

(58) Field of Classification Search
CPC ....... B82Y 10/00; G06N 99/002; G11C 13/04
See application file for complete search history.

(56) References Cited

U.S. PATENT DOCUMENTS

| 4,132,956 A | 1/1979 | Russer |
| 5,936,458 A * | 8/1999 | Rylov ....................... H03K 3/38 327/528 |
| 6,157,329 A * | 12/2000 | Lee ....................... H03M 3/408 341/133 |
| 9,735,776 B1 | 8/2017 | Abdo et al. |
| 2003/0039138 A1 * | 2/2003 | Herr ....................... G11C 11/44 365/160 |

(Continued)

FOREIGN PATENT DOCUMENTS

| EP | 3217336 A1 | 9/2017 |
| JP | S6192036 A | 5/1986 |

(Continued)

OTHER PUBLICATIONS

Hashimoto, et al: "Transmission of single-flux-quantum pulse between superconductor chips", Applied Physics Letters, A I P Publishing LLC, US, vol. 86, No. 7, Feb. 7, 2005 (Feb. 7, 2005). pp. 72502-072502, XP812066363, ISSN: 0003-6951, DOI: 10.1063/1.1864239 the whole document.

(Continued)

*Primary Examiner* — Sibin Chen
(74) *Attorney, Agent, or Firm* — Tarolli, Sundheim, Covell & Tummino LLP

(57) ABSTRACT

One example includes a superconducting transmission driver system. The system includes a latching gate stage comprising at least one Josephson junction configured to switch from an off state to an oscillating voltage state to provide an oscillating voltage at a control node in response to a single flux quantum (SFQ) pulse received at an input. The system further includes a low-pass filter stage coupled to the control node and configured to convert the oscillating voltage to a pulse signal to be transmitted over a transmission line.

20 Claims, 3 Drawing Sheets

(56) References Cited

U.S. PATENT DOCUMENTS

2005/0078022 A1    4/2005  Hirano et al.
2013/0043945 A1    2/2013  McDermott et al.

FOREIGN PATENT DOCUMENTS

| JP | 2001345488 A | 12/2001 |
| --- | --- | --- |
| JP | 2013-058998 A | 3/2013 |
| WO | 2009157532 A1 | 12/2009 |
| WO | 2016127021 A1 | 8/2016 |

OTHER PUBLICATIONS

International Search Report & Written Opinion issued for corresponding PCT/US2017/058497, dated Jan. 25, 2018.
Takeuchi, et al: "On-chip RSFQ microwave pulse generator using a multi-flux-quantum qubits", Physica C, vol. 470, No. 20, IS May 2818 (May 15, 2018), pp. 1558-1554, XP028167963, ISSN: 0921-4534, 001:10.1816/J.PHYSC.2010.05.159 [retrieved on May 15, 2010] p. 1550, right-hand column-p. 1551, left-hand column; figures 1,2, figure 4a.
International Search Report & Written Opinion corresponding to International Application No. PCT/US2018/0042466 dated Dec. 12, 2018.
International Search Report & Written Opinion corresponding to International Application No. PCT/US2018/051076 dated Jan. 2, 2019.
Schuenemann C. et al. "Interleaved Josephson junction tree decoder," IBM Technical Disclosure Bulletin, International Business Machines Corp. (Thorwood), US, vol. 18, No. 12, Apr. 30, 1976, pp. 4168, line 1-p. 4170, line 29; figures I, II.

* cited by examiner ately 300 GHz) interconnect system to maintain pulse integrity of single flux quantum (SFQ) pulses. Inter-chip (e.g., chip-to-chip) communication can typically include transitions between transmission lines on a chip to those on a circuit board through a stackup of chip vias, bump bonds, and board vias, particularly when fabricated on a large scale. Such features of inter-chip communication can result in degradation in bandwidth, and hence the pulse integrity and reliability of the data in the inter-chip communication. Moreover, dispersion on long superconducting transmission lines can degrade the pulses, and can be significantly worse at frequencies over 100 GHz.

SUMMARY

One example includes a superconducting transmission driver system. The system includes a latching gate stage comprising at least one Josephson junction configured to switch from an off state to an oscillating voltage state to provide an oscillating voltage at a control node in response to a single flux quantum (SFQ) pulse received at an input. The system further includes a low-pass filter stage coupled to the control node and configured to convert the oscillating voltage to a pulse signal to be transmitted over a transmission line.

Another example includes a superconducting transmission driver system. The system includes a latching gate stage comprising at least one Josephson junction configured to switch from an off state to an oscillating voltage state to provide an oscillating voltage at a control node in response to an SFQ pulse received at an input. The latching gate stage can include a self-reset stage coupled to the control node and being configured to switch the at least one Josephson junction from the oscillating voltage state to the off state after a predetermined duration of time to reset the latching gate stage. The system also includes a low-pass filter stage coupled to the control node and configured to convert the oscillating voltage to a pulse signal to be transmitted over a transmission line.

Another example includes an inter-chip transmission system. The system includes a superconducting transmission driver system. The superconducting transmission driver system includes a latching gate stage comprising at least one Josephson junction configured to switch from an off state to an oscillating voltage state to provide an oscillating voltage at a control node in response to an SFQ pulse received at an input. The superconducting transmission driver system also includes a low-pass filter stage coupled to the control node and configured to convert the oscillating voltage to a pulse signal to be transmitted over a transmission line. The system also includes a receiver system configured to receive the pulse signal and to convert the pulse signal into a SFQ pulse. The system further includes a transmission line configured to propagate the pulse signal between the superconducting transmission driver system and the receiver system.

DETAILED DESCRIPTION

This disclosure relates generally to classical and quantum computing systems, and more specifically to a superconducting transmission driver system. The superconducting transmission driver system can be implemented in a variety of superconducting inter-chip communication systems, such as in a reciprocal quantum logic (RQL) computer system. The superconducting transmission driver system includes a latching gate stage and a low-pass filter stage. The latching gate stage can include at least one Josephson junction that is configured to switch from an off state to an oscillating voltage state to provide an oscillating voltage at a control node in response to a single flux quantum (SFQ) pulse received at an input. As an example, the SFQ pulse can be configured as a reciprocal quantum logic (RQL) pulse (e.g., including a positive fluxon and a negative fluxon) that is received from an RQL Josephson transmission line (JTL). The low-pass filter stage can be configured to generate a pulse signal based on the oscillating voltage, such that the pulse signal can be transmitted at an output (e.g., via a transmission line).

Additionally, the superconducting transmission stage can include a self-reset stage coupled to the control node. The self-reset stage can be configured, for example, as a low-pass filter (e.g., an RL filter) that interconnects a DC bias source from the control node, and is configured to provide shunting of the oscillating voltage to decrease the oscillating voltage over a predetermined duration of time, such as based on a time constant associated with the associated low-pass filter. As a result, the self-reset stage can be configured to reset the latching gate stage, and thus conclude the transmission of the pulse signal (e.g., provide the falling-edge of the pulse signal). In addition, as described previously, the superconducting transmission driver system can be configured as a driver in an RQL system. Therefore, the latching gate stage can include an input Josephson junction that is configured to trigger to cancel a negative fluxon associated with the RQL input pulse, such that the latching gate stage rejects the negative fluxon in generating the pulse signal.

Figure 1:
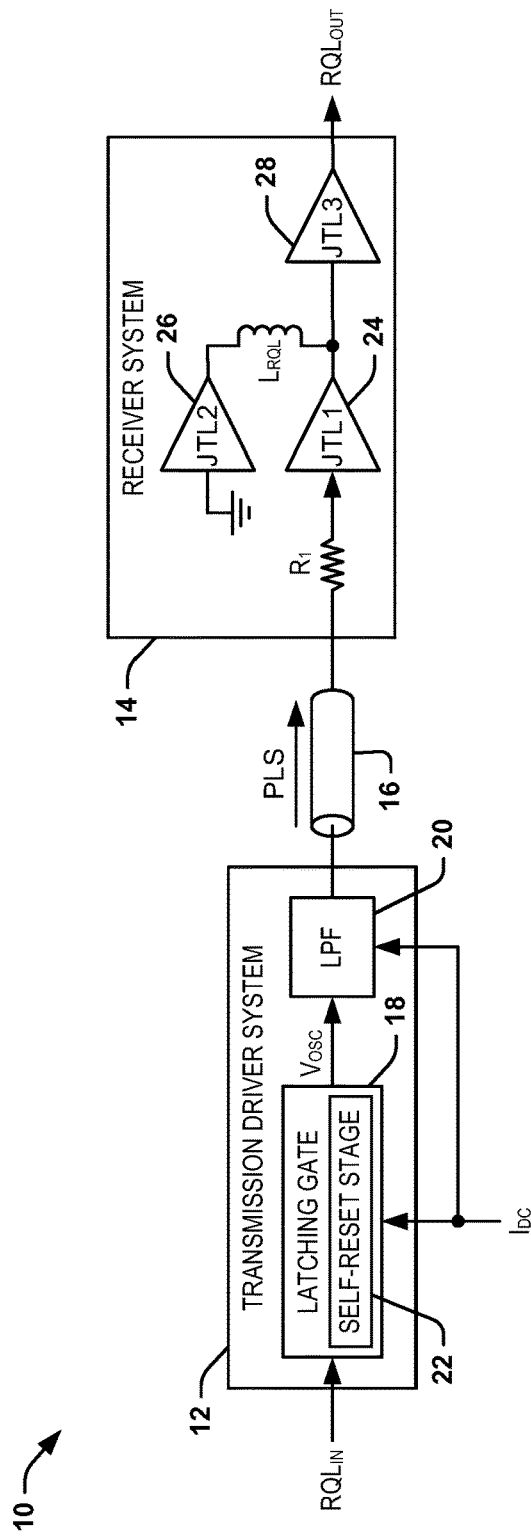
FIG. 1 illustrates an example of a superconducting inter-chip transmission system.

FIG. 1 illustrates an example of a superconducting inter-chip transmission system 10. The superconducting inter-chip transmission system 10 can be implemented in any of a variety of computer systems to provide inter-chip communication in a superconducting data transfer (e.g., in a reciprocal quantum logic (RQL) communication system).

The superconducting inter-chip transmission system 10 includes a transmission driver system 12 and a receiver system 14 that are separated by a transmission line 16. In the example of FIG. 1, the receiver system 14 is demonstrated as a synchronous receiver. However, it is to be understood that the receiver system 14 could instead be configured as an isochronous receiver. The transmission driver system 12 is configured to receive an RQL input signal, demonstrated in the example of FIG. 1 as a signal $RQL_{IN}$. As an example, the RQL input signal $RQL_{IN}$ can be provided from an RQL Josephson transmission line (JTL), such as operating to propagate the RQL input signal $RQL_{IN}$ based on an RQL clock signal (e.g., a quadrature clock signal). The transmission driver system 12 is further configured to transmit the signal $RQL_{IN}$ as a substantially Gaussian pulse signal PLS across the transmission line 16 to the receiver system 14. As an example, the pulse signal PLS can have an amplitude of approximately 2.0 mV, and can have a pulse-width of approximately ten picoseconds. As described in greater detail herein, the transmission driver system 12 is configured to generate the pulse signal PLS in a manner that decreases bandwidth, and thus allows transmission of the data represented by the RQL pulse $RQL_{IN}$ to be received by the receiver system 14. As an example, the transmission driver system 12 can be or can be implemented in a transmitter system, such as including additional components, such as additional JTLs and/or additional transmission driver systems 12, such as to provide multiple pulse signals PLS over a bus.

The transmission driver system 12 includes a latching gate stage 18 that is configured to generate an oscillating voltage $V_{OSC}$ in response to the RQL input signal $RQL_{IN}$. As an example, the latching gate stage 18 includes at least one unshunted Josephson junction that is configured to switch from an off state to an oscillating voltage state in response to the RQL input signal $RQL_{IN}$ and a DC bias current $I_{DC}$. The oscillating voltage $V_{OSC}$ is provided to a low-pass filter (LPF) stage 20 that is associated with the transmission driver system 12. The LPF stage 20 can thus generate the pulse signal PLS based on the oscillating voltage $V_{OSC}$ based on filtering the oscillating voltage $V_{OSC}$. Therefore, the pulse signal PLS can have a rising-edge that corresponds to the activation of the oscillating voltage $V_{OSC}$, and thus the switching of the at least one unshunted Josephson junction from the off state to the oscillating voltage state.

In addition, in the example of FIG. 1, the latching gate stage 18 includes a self-reset stage 22. The self-reset stage 22 can be configured, for example, as a low-pass filter (e.g., an RL filter) that interconnects the DC bias current $I_{DC}$ and the oscillating voltage $V_{OSC}$. The self-reset stage 22 is configured to provide shunting of the oscillating voltage $V_{OSC}$ to decrease the oscillating voltage $V_{OSC}$ over a predetermined duration of time, such as based on a time constant associated with the associated low-pass filter of the self-reset stage 22. As a result, the self-reset stage 22 can be configured to reset the latching gate stage 18 by deactivating the oscillating voltage $V_{OSC}$. Therefore, the pulse signal PLS can have a falling-edge that corresponds to the deactivation of the oscillating voltage $V_{OSC}$, and thus the switching of the at least one unshunted Josephson junction from the oscillating voltage state to the off state.

The pulse signal PLS is provided to the receiver system 14. The receiver system 14 includes a first JTL 24 that is configured to convert the received pulse signal PLS via a resistor R1. As an example, the resistor R1 can have a resistance value (e.g., approximately 20Ω) that is associated with at least one Josephson junction associated with the first JTL 24. As an example, the first JTL 24 can receive an AC bias current to convert the received pulse signal PLS into an SFQ signal based on the triggering of at least one Josephson junction in response to the pulse signal PLS. The receiver system 14 also includes a second JTL 26 that is arranged with respect to the first JTL 24 to provide a negative fluxon through an inductor $L_{RQL}$ in response to the SFQ pulse provided by the first JTL 24. As a result, the first and second JTLs 24 and 26 can cooperate to generate an RQL signal in response to the pulse signal PLS. The receiver system 14 further includes a third JTL 28 that is configured to propagate the RQL signal generated by the first and second JTLs 24 and 26 as an RQL output signal $RQL_{OUT}$. The RQL output signal $RQL_{OUT}$ can thus be processed by additional circuitry (not shown).

Figure 2:
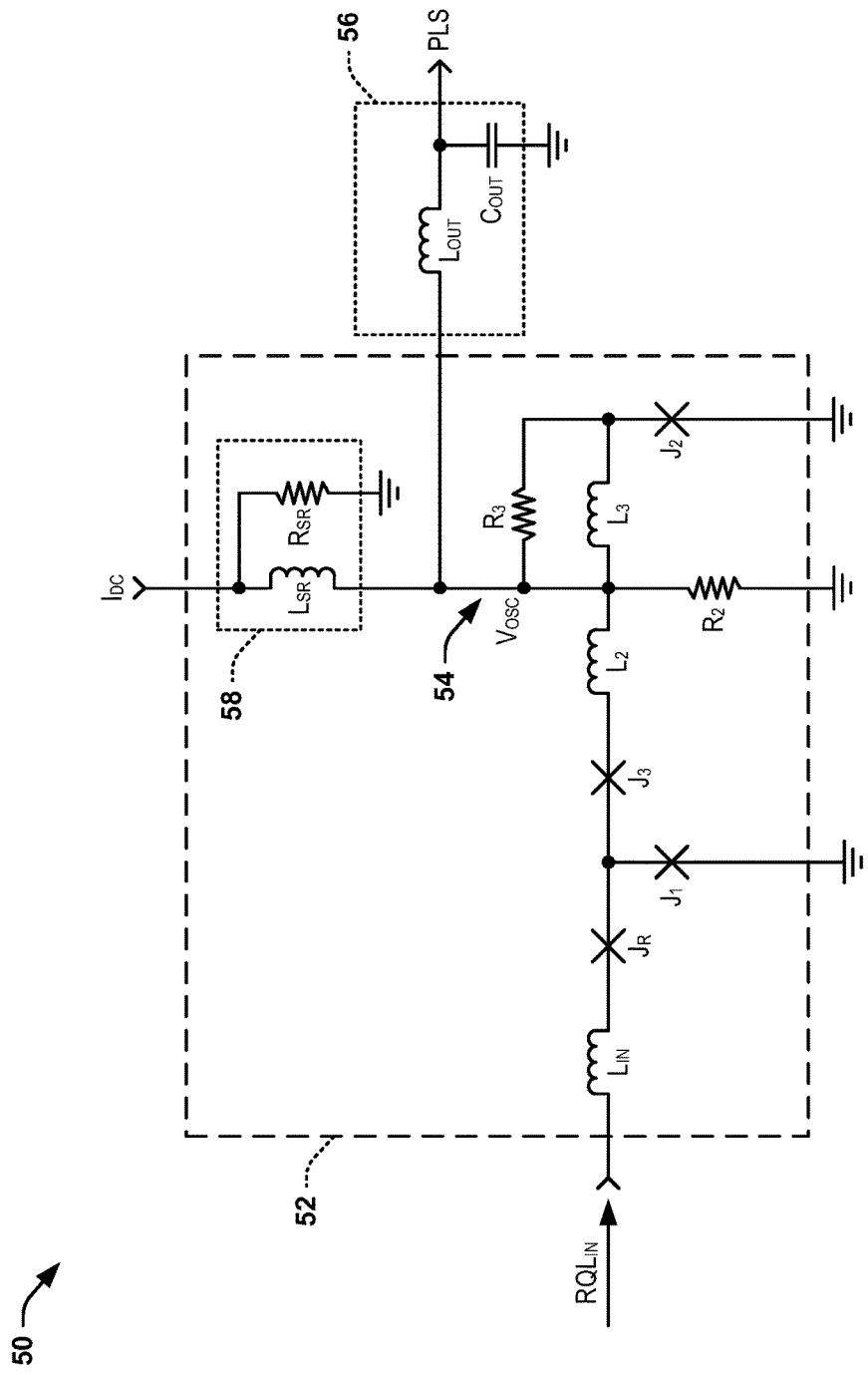
FIG. 2 illustrates an example of a transmission driver system.

FIG. 2 illustrates an example of a transmission driver system 50. The transmission driver system 50 can correspond to the transmission driver system 12 in the example of FIG. 1. The transmission driver system 50 receives an input RQL signal, demonstrated in the example of FIG. 2 as a signal $RQL_{IN}$, that is propagated to the transmission driver system 50. While the description of the superconducting inter-chip transmission system 10 and the transmission driver system 50 describes RQL signal transfer, it is to be understood that the superconducting inter-chip transmission system 10 and the transmission driver system 50 could instead implement SFQ signal transfer.

The transmission driver system 50 includes a latching gate stage 52 that receives a DC bias current $I_{DC}$, such as from a DC bias current source. The latching gate stage 52 also receives the RQL input signal $RQL_{IN}$, such as via an RQL JTL. As an example, the RQL input signal $RQL_{IN}$ can be provided from an RQL JTL, such as operating to propagate the RQL input signal $RQL_{IN}$ based on an RQL clock signal (e.g., a quadrature clock signal). The RQL input signal $RQL_{IN}$ is provided through an input inductor $L_{IN}$ and through an input Josephson junction $J_R$. The RQL input signal $RQL_{IN}$ is configured to trigger a first Josephson junction $J_1$ based on the bias provided from the DC bias current $I_{DC}$. The triggering of the first Josephson junction $J_1$ provides an SFQ pulse that propagates through an inductor $L_2$ to a control node 54, and through another inductor $L_3$ to a first unshunted Josephson junction $J_2$. In the example of FIG. 2, the control node 54 is separated from ground via a resistor $R_2$, and the inductor $L_3$ is arranged in parallel with a resistor $R_3$ between the control node 54 and the first unshunted Josephson junction $J_2$.

In response to the SFQ pulse propagated from the first Josephson junction $J_1$, and in response to the DC bias current $I_{DC}$, the first unshunted Josephson junction $J_2$ triggers to switch from an off state to an oscillating voltage stage, which provides an oscillating voltage $V_{OSC}$ at the control node 54. In response to the triggering of the first unshunted Josephson junction $J_2$, the oscillating voltage $V_{OSC}$ and the DC bias current $I_{DC}$ cooperate to switch a second unshunted Josephson junction $J_3$ from an off state to an oscillating voltage state. Therefore, the first and second unshunted Josephson junctions $J_2$ and $J_3$ combine the respective oscillating voltage states to provide the oscillating voltage $V_{OSC}$ at the control node 54.

In the example of FIG. 2, the transmission driver system 50 also includes an LPF stage 56 that is coupled to the control node 54. In the example of FIG. 2, the LPF stage 56 is configured as an LC filter that includes an inductor LOUT and a capacitor COUT. Thus, the LPF stage 56 can generate the pulse signal PLS based on the oscillating voltage $V_{OSC}$ at the control node 54 being filtered via the LC filtering of the inductor LOUT and the capacitor COUT. Therefore, the pulse signal PLS can have a rising-edge that corresponds to the activation of the oscillating voltage $V_{OSC}$, and thus the switching of the first and second unshunted Josephson junctions from the off state to the oscillating voltage state.

In addition, in the example of FIG. 2, the latching gate stage 52 includes a self-reset stage 58. The self-reset stage 58 is demonstrated as an RL filter that includes an inductor LSR and a resistor RSR, with the inductor LSR interconnecting the DC bias current $I_{DC}$ to the control node 54 and the resistor RSR interconnecting the source node of the DC bias current $I_{DC}$ to ground. The RL filter can thus have an associated time constant, such that the self-reset stage 58 is configured to provide shunting of the oscillating voltage $V_{OSC}$. Therefore, the self-reset stage 58 is configured to decrease the oscillating voltage $V_{OSC}$ over a predetermined duration that is based on the time constant. As a result, the self-reset stage 58 can be configured to reset the latching gate stage 18 by deactivating the oscillating voltage $V_{OSC}$. Therefore, the pulse signal PLS can have a falling-edge that corresponds to the deactivation of the oscillating voltage $V_{OSC}$, and thus the switching of the unshunted Josephson junctions $J_2$ and $J_3$ from the oscillating voltage state to the off state.

As described previously, the RQL input signal $RQL_{IN}$ is configured as an RQL pulse, such that the RQL input signal $RQL_{IN}$ includes a positive fluxon and a subsequent negative fluxon. In the example of FIG. 2, the latching gate stage 52 includes a rejection Josephson junction $J_R$ that is arranged in the input path of the RQL input signal $RQL_{IN}$. The rejection Josephson junction $J_R$ is configured to trigger in response to the negative fluxon associated with the RQL input signal $RQL_{IN}$, and thus provides a voltage pulse that substantially cancels the negative fluxon. Accordingly, the rejection Josephson junction $J_R$ is configured to cancel the negative fluxon. However, it is to be understood that the generation of oscillating voltage $V_{OSC}$, and thus the pulse signal PLS, is based on an SFQ pulse (e.g., only a fluxon). Therefore, while the input signal to the transmission driver system 50 is demonstrated in the example of FIG. 2 as an RQL signal, the input signal could instead be an SFQ pulse, such as in a rapid single flux quantum (RSFQ) logic system.

Based on the generation of the pulse signal PLS based on the RQL input signal $RQL_{IN}$, the bandwidth of the communication across the transmission line 16 can be substantially reduced. As a result, the transmission of the data via the elongated pulse signal PLS relative to the RQL input signal $RQL_{IN}$ provides improvements in pulse integrity and reliability of the data in the inter-chip communication, relative to tranmission of SFQ pulses. As an example, the bandwidth can be decreased by a factor of approximately five, to provide a bandwidth of approximately 60 GHz. As a result, manufacturing requirements for the inter-chip interconnect system can be substantially reduced, which can reduce the dispersion effects in superconducting material (e.g., niobium Nb) that can limit maximum transmission line length. As an example, the pulse signal PLS can be driven at least one meter along the transmission line 16 on a printed circuit board, and at least approximately 150 mm on-chip, which is approximately an order of magnitude improved relative to existing SFQ transmission line circuits. Accordingly, the transmission driver sytem 50 can provide substantial improvement in transmitting data in a superconducting circuit system.

Figure 3:
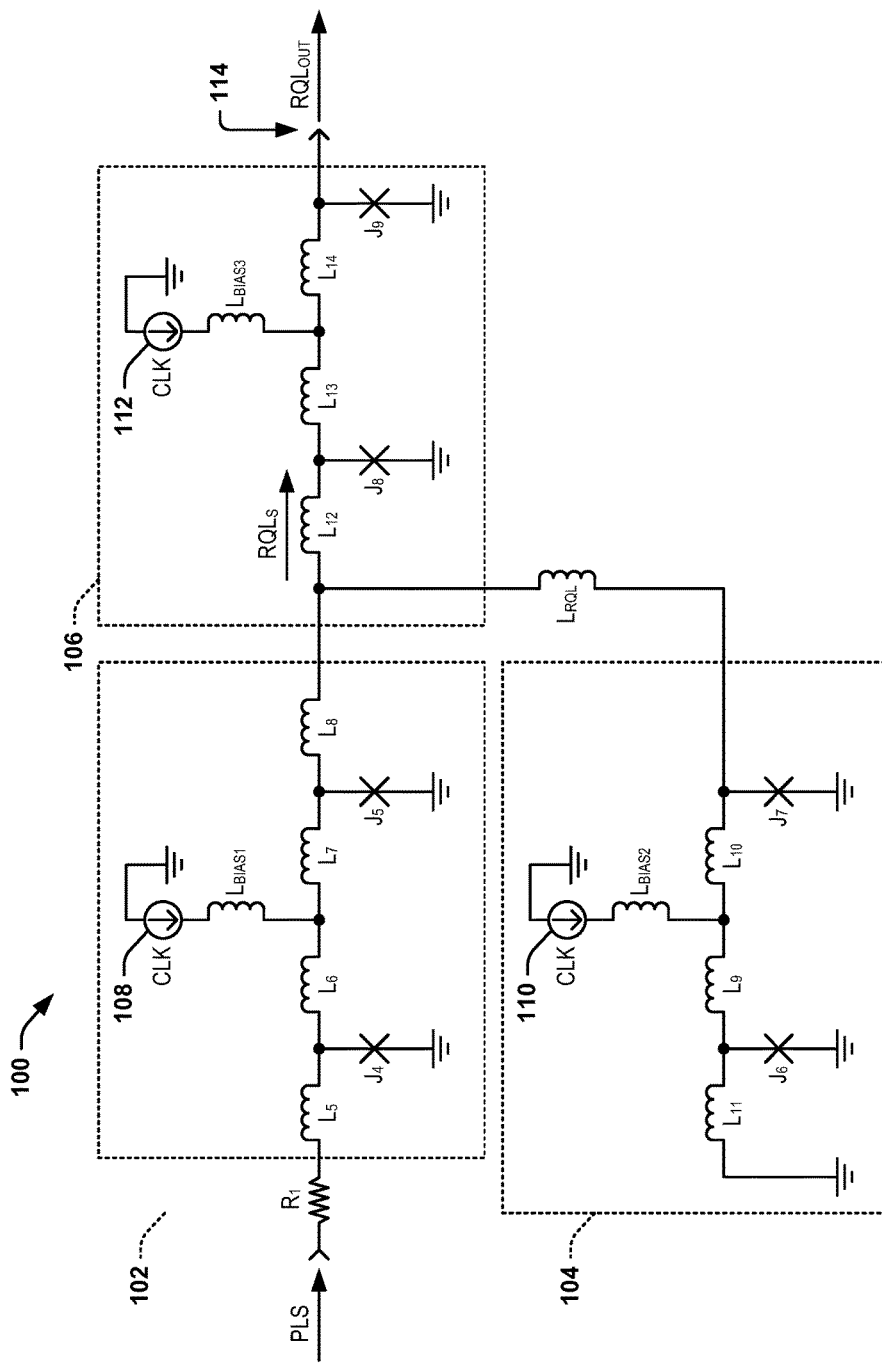
FIG. 3 illustrates an example of a receiver system.

FIG. 3 illustrates an example of a receiver system 100. The receiver system 100 can correspond to the receiver system 14 in the example of FIG. 1, and can thus be configured to generate an RQL output signal $RQL_{OUT}$ in response to the pulse signal PLS being received via the transmission line 16, such as generated via the transmission driver system. In the example of FIG. 3, the receiver system 100 is demonstrated as a synchronous receiver. However, it is to be understood that the receiver system 100 could instead be configured as an isochronous receiver.

The receiver system 100 includes a series termination resistor $R_1$ (e.g., 20Ω), a first input JTL stage 102 and a second input JTL stage 104. The first input JTL stage 102 is configured to receive the input pulse signal PLS and propagate the pulse signal PLS to an output JTL stage 106. The first input JTL stage 102 includes an input inductor $L_5$ through which the pulse signal PLS propagates, and a first Josephson junction $J_4$ that is triggered in response to the pulse signal PLS based on bias current source 108, configured as an AC current source that is associated with a particular respective sampling phase associated with the AC clock signal CLK. The bias current flows through a first bias inductor $L_{BIAS1}$ to bias the first Josephson junction $J_4$ and a second Josephson junction $J_5$ via respective inductors $L_6$ and $L_7$, such that the pulse signal PLS propagates through the inductors $L_6$ and $L_7$ in response to the first Josephson junction $J_4$ triggering, to subsequently trigger the Josephson junction $J_5$ to provide the pulse signal PLS to the output driver stage 106 via an inductor $L_8$.

The second input JTL stage 104 is configured substantially similarly with respect to the first input JTL stage 102. Particularly, the second input JTL stage 104 includes a pair of Josephson junctions $J_6$ and $J_7$ that are arranged opposite each other with respect to bias current source 110, configured as an AC current source that is associated with a particular respective sampling phase associated with the AC clock signal CLK. This bias current flows through a second bias inductor $L_{BIAS2}$ and through inductors $L_9$ and $L_{10}$. However, the second input JTL stage 104 also includes an inductor $L_{11}$ that is coupled to ground, such that the second input JTL stage 104 generates an anti-fluxon in response to the fluxon corresponding to the pulse signal PLS that propagates through an inductor $L_{RQL}$. Therefore, in response to the pulse signal PLS being provided at the first input JTL stage 102, the second input JTL stage 104 generates a corresponding anti-fluxon to provide an RQL signal $RQL_S$ at the output JTL stage 106.

The output JTL stage 106 is arranged substantially similar to the first and second input JTL stages 102 and 104. The output JTL stage 106 includes an input inductor $L_{12}$ through which the RQL signal $RQL_S$ propagates, as well as a pair of Josephson junctions $J_8$ and $J_9$ that are arranged opposite each other with respect to a bias current source 112 and respective inductors $L_{13}$ and $L_{14}$. However, the bias current source 112 is configured as an AC current source that is associated with a particular respective sampling phase associated with the AC clock signal CLK. In the example of FIG. 3, the AC current is demonstrated as a signal CLK that is provided through a bias inductor $L_{BIAS3}$, where the AC clock signal CLK can correspond to a quadrature signal including an in-phase component and a quadrature-phase component. Therefore, the output JTL stage 106 is configured to propagate the RQL signal generated by the first and second JTL stages 102 and 104 as an RQL output signal $RQL_{OUT}$ at an output 114. The RQL output signal $RQL_{OUT}$ can thus be processed by additional circuitry (not shown). Accordingly, the receiver system 100 can be configured to receive the pulse signal PLS from the transmission line (e.g., the transmission line 16) based on the reduced bandwidth of the pulse signal PLS relative to an SFQ pulse.

What have been described above are examples of the disclosure. It is, of course, not possible to describe every conceivable combination of components or method for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims.

What is claimed is:

1. A superconducting transmission driver system comprising:
    a latching gate stage comprising at least one Josephson junction configured to switch from an off state to an oscillating voltage state to provide an oscillating voltage at a control node in response to a single flux quantum (SFQ) pulse received at an input; and
    a low-pass filter stage coupled to the control node and configured to convert the oscillating voltage to a pulse signal to be transmitted over a transmission line.

2. The system of claim 1, wherein the latching gate comprises a self-reset stage coupled to the control node and being configured to switch the at least one Josephson junction from the oscillating voltage state to the off state after a predetermined duration of time to reset the latching gate stage.

3. The system of claim 2, wherein the self-reset stage is configured as an inductor-resistor (LR) low-pass filter configured to provide damping of the oscillating voltage to switch the at least one Josephson junction from the oscillating voltage state to the off state based on a time constant of the LR low-pass filter corresponding to the predetermined duration of time.

4. The system of claim 2, wherein the latching gate stage is configured to switch the at least one Josephson junction from the off state to the oscillating voltage state in response to the SFQ pulse received at the input and a DC bias current, wherein the self-reset stage is arranged as interconnecting the control node and a source of the DC bias current.

5. The system of claim 1, wherein the at least one Josephson junction is unshunted to switch from the off state to the oscillating voltage state in response to the SFQ pulse received at the input.

6. The system of claim 1, wherein the at least one Josephson junction comprises a first Josephson junction that is coupled to the control node via a first inductor and a second Josephson junction that is coupled to the control node via a second inductor, wherein the first Josephson junction is configured to trigger in response to the SFQ pulse to switch to the oscillating voltage state, and wherein the second Josephson junction is configured to trigger in response to the first Josephson junction switching to the oscillating voltage state to likewise switch to the oscillating voltage state.

7. The system of claim 1, further comprising a reciprocal quantum logic (RQL) Josephson transmission line (JTL) that is configured to provide the SFQ pulse to the input as an RQL pulse comprising a positive fluxon and a negative fluxon, wherein the latching gate system is configured to reject the negative fluxon.

8. The system of claim 7, wherein the latching gate system comprises an input Josephson junction that is arranged to trigger in response to the negative fluxon to substantially cancel the negative fluxon at the control node.

9. An inter-chip transmission system comprising the superconducting transmission driver system of claim 1, the inter-chip transmission system further comprising:
    a receiver system configured to receive the pulse signal and to convert the pulse signal into a SFQ pulse;
    wherein the transmission line is configured to propagate the pulse signal between the superconducting transmission driver system and the receiver system.

10. The inter-chip transmission system of claim 9, wherein the receiver system is configured as an RQL receiver system, the receiver system further comprising:
    a first Josephson transmission line (JTL) configured to convert the pulse signal to a positive fluxon; and
    a second JTL interconnecting an output of the first JTL and ground and being configured to generate a negative fluxon in response to the positive fluxon to generate an RQL pulse.

11. A superconducting transmission driver system comprising:
    a latching gate stage comprising at least one Josephson junction configured to switch from an off state to an oscillating voltage state to provide an oscillating voltage at a control node in response to a single flux quantum (SFQ) pulse received at an input, wherein the latching gate stage comprises a self-reset stage coupled to the control node and being configured to switch the at least one Josephson junction from the oscillating voltage state to the off state after a predetermined duration of time to reset the latching gate stage; and
    a low-pass filter stage coupled to the control node and configured to convert the oscillating voltage to a pulse signal to be transmitted over a transmission line.

12. The system of claim 11, wherein the self-reset stage is configured as an inductor-resistor (LR) low-pass filter configured to provide damping of the oscillating voltage to switch the at least one Josephson junction from the oscillating voltage state to the off state based on a time constant of the LR low-pass filter corresponding to the predetermined duration of time.

13. The system of claim 11, wherein the at least one Josephson junction is unshunted to switch from the off state to the oscillating voltage state in response to the SFQ pulse received at the input.

14. The system of claim 11, wherein the at least one Josephson junction comprises a first Josephson junction that is coupled to the control node via a first inductor and a second Josephson junction that is coupled to the control node via a second inductor, wherein the first Josephson junction is configured to trigger in response to the SFQ pulse to switch to the oscillating voltage state, and wherein the second Josephson junction is configured to trigger in response to the first Josephson junction switching to the oscillating voltage state to likewise switch to the oscillating voltage state.

15. The system of claim 11, further comprising a reciprocal quantum logic (RQL) Josephson transmission line (JTL) that is configured to provide the SFQ pulse to the input as an RQL pulse comprising a positive fluxon and a negative fluxon, wherein the latching gate system is configured to reject the negative fluxon.

16. The system of claim 15, wherein the latching gate system comprises an input Josephson junction that is arranged to trigger in response to the negative fluxon to substantially cancel the negative fluxon at the control node.

17. An inter-chip transmission system comprising:
    a superconducting transmission driver system comprising:
        a latching gate stage comprising at least one Josephson junction configured to switch from an off state to an oscillating voltage state to provide an oscillating voltage at a control node in response to a single flux quantum (SFQ) pulse received at an input; and a low-pass filter stage coupled to the control node and configured to convert the oscillating voltage to a pulse signal to be transmitted over a transmission line;

a receiver system configured to receive the pulse signal and to convert the pulse signal into a SFQ pulse; and a transmission line configured to propagate the pulse signal between the superconducting transmission driver system and the receiver system.

18. The system of claim 17, wherein the latching gate comprises a self-reset stage comprising an inductor-resistor (LR) low-pass filter coupled to the control node and being configured to provide damping of the oscillating voltage to switch the at least one Josephson junction from the oscillating voltage state to the off state based on a time constant of the LR low-pass filter.

19. The system of claim 17, wherein the at least one Josephson junction is unshunted to switch from the off state to the oscillating voltage state in response to the SFQ pulse received at the input.

20. The system of claim 17, further comprising a reciprocal quantum logic (RQL) Josephson transmission line (JTL) that is configured to provide the SFQ pulse to the input as an RQL pulse comprising a positive fluxon and a negative Dixon, wherein the latching gate system comprises an input Josephson junction that is arranged to trigger in response to the negative fluxon to substantially cancel the negative fluxon at the control node.

* * * * *